United States Patent [19]
Busby

[11] Patent Number: 6,095,335
[45] Date of Patent: *Aug. 1, 2000

[54] WAFER SUPPORT DEVICE HAVING A RETROFIT TO PROVIDE SIZE CONVERTIBILITY

[75] Inventor: William G. Busby, San Jose, Calif.

[73] Assignee: H-Square Corporation, Sunnyvale, Calif.

[*] Notice: This patent issued on a continued prosecution application filed under 37 CFR 1.53(d), and is subject to the twenty year patent term provisions of 35 U.S.C. 154(a)(2).

[21] Appl. No.: 09/113,698

[22] Filed: Jul. 10, 1998

[51] Int. Cl.⁷ ............................................. B65D 85/00
[52] U.S. Cl. ..................... 206/711; 206/832; 206/454; 211/41.18; 220/533
[58] Field of Search .................... 206/710, 454, 206/711, 725, 722, 832; 414/217, 292, 404, 407; 220/532, 533; 211/40, 41.18; 118/500

[56] References Cited

U.S. PATENT DOCUMENTS

| | | | |
|---|---|---|---|
| 3,467,242 | 9/1969 | De Rousse | 206/454 |
| 4,261,464 | 4/1981 | Maitland | 206/334 |
| 4,308,953 | 1/1982 | Cohen | 206/454 |
| 4,446,966 | 5/1984 | Moloney | 206/334 |
| 4,574,950 | 3/1986 | Koe et al. | 206/334 |
| 4,602,715 | 7/1986 | Sarver et al. | 206/523 |
| 5,653,565 | 8/1997 | Bonora et al. | |
| 5,706,946 | 1/1998 | Kakizaki et al. | 206/454 |
| 5,711,427 | 1/1998 | Nyseth | |
| 5,755,332 | 5/1998 | Holliday et al. | |

*Primary Examiner*—Paul T. Sewell
*Assistant Examiner*—Nhan T. Lam
*Attorney, Agent, or Firm*—Terry McHugh

[57] ABSTRACT

A size-convertible device for supporting wafers in a parallel relationship includes a removable insert that enables the device to be non-destructively switched from providing edge support for large diameter wafers to providing edge support for small diameter wafers. The insert maintains the original wafer pitch and the original insertion angle. In the preferred embodiment, the device is a Front Opening Unified Pod (FOUP) specifically designed for use with 300 mm diameter wafers. Inserts are releasably attached to opposite sides of the FOUP to convert the device to a 200 mm diameter pod. The axis of the rest positions of the small wafers is coaxial with the rest positions of the large wafers. However, the inserts may be adapted to move the rest positions of the small wafers forwardly to a position such that there is front edge alignment with respect to rest positions of the large and small wafers.

9 Claims, 7 Drawing Sheets

WAFER SUPPORT DEVICE HAVING A RETROFIT TO PROVIDE SIZE CONVERTIBILITY

TECHNICAL FIELD

The invention relates generally to devices for storing semiconductor wafers in a parallel relationship and more particularly to devices that are convertible with respect to storing wafers of different sizes.

BACKGROUND ART

Wafer transfer systems are used to provide an automated transfer of semiconductor wafers from one position to another position. For example, the wafers contained in a cassette may be moved individually to a processing chamber for depositing and patterning layers of material for forming integrated circuit chips. Robotic handling devices are preferred, since human handling is more likely to cause contamination.

Conventional cassettes include slots that support the wafers in a vertical orientation. An automated wafer transfer system may then be used to move semiconductor wafers between a cassette and a processing chamber. U.S. Pat. No. 4,449,885 to Hurtel et al. describes an automated system that includes a cassette conveyor assembly for properly positioning a cassette of vertical wafers relative to an elevator blade which vertically raises and lowers individual wafers to and from a processing chamber. The elevator blade passes upwardly through the cassette to contact a lower edge of a wafer. The wafer is then raised to a position in which the elevator blade transfers the wafer to a vacuum chuck. Following the transfer, the vacuum chuck is retracted to position the wafer within the chamber. When the processing of the wafer has been completed, the vacuum chuck returns the wafer to a position for transfer to the elevator blade. The wafer is lowered to its original position within the cassette, and the cassette conveyor moves the cassette to a position aligned for pickup of the next wafer by the elevator blade. Transfer systems of this type require a precise positioning of the wafers within the cassette. The movement provided by the cassette conveyor between each lift operation must be compatible with the distance between the wafers within the cassette.

Another type of wafer storage device is referred to as a Standardized Mechanical InterFace (SMIF) pod. A SMIF pod is described in U.S. Pat. No. 5,653,565 to Bonora et al. The wafers are held in a horizontal orientation, rather than a vertical orientation. The wafers are located within the wafer-carrying cassette that is stored and transported between processing stations in the sealed SMIF pod. A SMIF pod for housing a cassette adapted for 200 mm diameter wafers may have a base with a rectangular footprint having a length of approximately 280 mm and a width of approximately 260 mm. The height of the pod is selected to accommodate a particular cassette. The pod includes a cover that mates with a door to provide a sealed environment for the wafers within the cassette. When the wafers are to be transferred to a processing station, the pod is placed onto an access port of a transfer system such that the pod door is in contact with the access port. In Bonora et al., the pod door is at a lower surface of the SMIF pod, so that when an elevator lowers the pod door, the cassette and its wafers are lowered into a processing chamber.

As noted in the Bonora et al. patent, there are different-sized wafers that require cassettes having different dimensions. Wafers having a diameter of 300 mm are now being used. Therefore, equipment has been designed to accommodate 300 mm wafers. One type of 300 mm SMIF pod includes a base having a circular footprint, as compared to the rectangular footprint of the 200 mm SMIF pod. Bonora et al. provide an adaptor plate that achieves "backward compatibility," i.e., the ability to use 200 mm SMIF pods with access ports of wafer processing equipment configured to accept 300 mm SMIF pods.

Another type of wafer container is described in U.S. Pat. No. 5,711,427 to Nyseth. The Nyseth wafer container is used for 300 mm diameter semiconductor wafers. The container is sometimes referred to in the industry as a Front Opening Unified Pod (FOUP), since an access door is located on a side that is perpendicular to horizontally stored wafers. Automated transfer systems for use with FOUPs have been designed. The transfer systems are significantly different than systems used with other types of containers, since the door is vertically mounted and the wafers are horizontally stored. Moreover, the center-to-center distance (i.e., pitch) of the wafers within a FOUP is greater than the center-to-center distance between wafers within a container of a different standard. For example, the pitch of 300 mm wafers within a FOUP is approximately 10 mm, while the pitch of wafers within a standard cassette of 200 mm wafers may be approximately 6.35 mm. The difference in the position of the door and the difference in the pitch render it difficult for FOUP-specific wafer transfer systems to be used to process 200 mm wafers. That is, the position of the door and the wafer pitch inhibit backward compatibility.

What is needed is a wafer-storage device which is convertible with respect to storing different-sized semiconductor wafers for presentation to automated transfer equipment specifically designed for handling one of the wafer sizes.

SUMMARY OF THE INVENTION

A size-convertible device for supporting wafers in a parallel relationship includes a housing that forms an interior region and an opening that cooperates with a first array of ribs to define a wafer-insertion angle. The first array of ribs has a fixed pitch and has a configuration that provides edge support for parallel large diameter semiconductor wafers, thereby defining a first wafer-rest configuration. The size-convertible device also includes at least one insert that is releasably attached to the interior region of the housing. Each insert includes second ribs having the same pitch as the first array of ribs. The second ribs cooperate to provide edge support for smaller diameter wafers, thereby defining a second wafer-rest configuration.

In the preferred embodiment, the second ribs are radially inward of the first array of ribs, so that each second rib is coplanar with a rib of the first array. The first and second wafer-rest configurations may be coplanar or may be arranged such that the front edges of the wafers stored in the device will be in the same position regardless of whether the wafers are the small or large diameter wafers. The compatibility with respect to the positioning of wafers supported within the device provides backward compatibility with respect to handling the smaller diameter wafers by transfer systems designed to handle the large diameter wafers.

In the most preferred embodiment, the size-convertible device is a Front Opening Unified Pod (FOUP) having a retractable door. The FOUP may be designed to support 300 mm diameter wafers, such as the ones sold by Empak, Inc. under the federally registered trademark CAPSil. The standardized pitch of a 300 mm FOUP is 10 mm, which is greater than the standardized pitch of 200 mm cassettes.

Nevertheless, the second array of ribs has the same pitch as the first array, allowing robotic equipment that is programmed to handle the 300 mm wafers to be used for handling 200 mm wafers without reprogramming.

While not critical, there may be two inserts that are releasably coupled at opposite sides of the interior region of the size-convertible device. For example, each insert may include a hook and may include fasteners that provide a secure coupling of the inserts to the device.

Preferably, the device includes a mechanism for selectively adjusting the inserts such that the rest positions of the smaller diameter semiconductor wafers may be moved forwardly or rearwardly. In the rearward condition, the rest positions of the smaller diameter wafers are coaxial with the rest positions of the larger diameter wafers. In the forward condition, the front edges of the smaller diameter wafers are in the same positions as the front edges of the larger diameter wafers when the inserts are removed to store the larger diameter wafers. The desired condition of the rest positions depends upon the wafer handling equipment with which the device is to be used. In one embodiment, the mechanism that allows adjustment of the rest position is the inclusion or exclusion of adapter members.

One advantage of the invention is that a retrofit converts a wafer supporting device, such as a FOUP, from use with one size wafer to use with a smaller size wafer, but maintains the wafer pitch and the wafer insertion angle. As a consequence, the smaller-sized wafers will "appear" to be the large wafers to handling equipment designed for the large wafers. The backward compatibility eliminates the need to have separate handling equipment for the two types of wafers. The conversion from the large wafer storage capacity to the smaller wafer storage capacity is "non-destructive," since the inserts are easily removed. Another advantage is that by using the adapter members, the rest positions of the smaller wafers may be moved forwardly or rearwardly, enhancing the backward compatibility of the size-convertible device.

DETAILED DESCRIPTION

Figure 1:
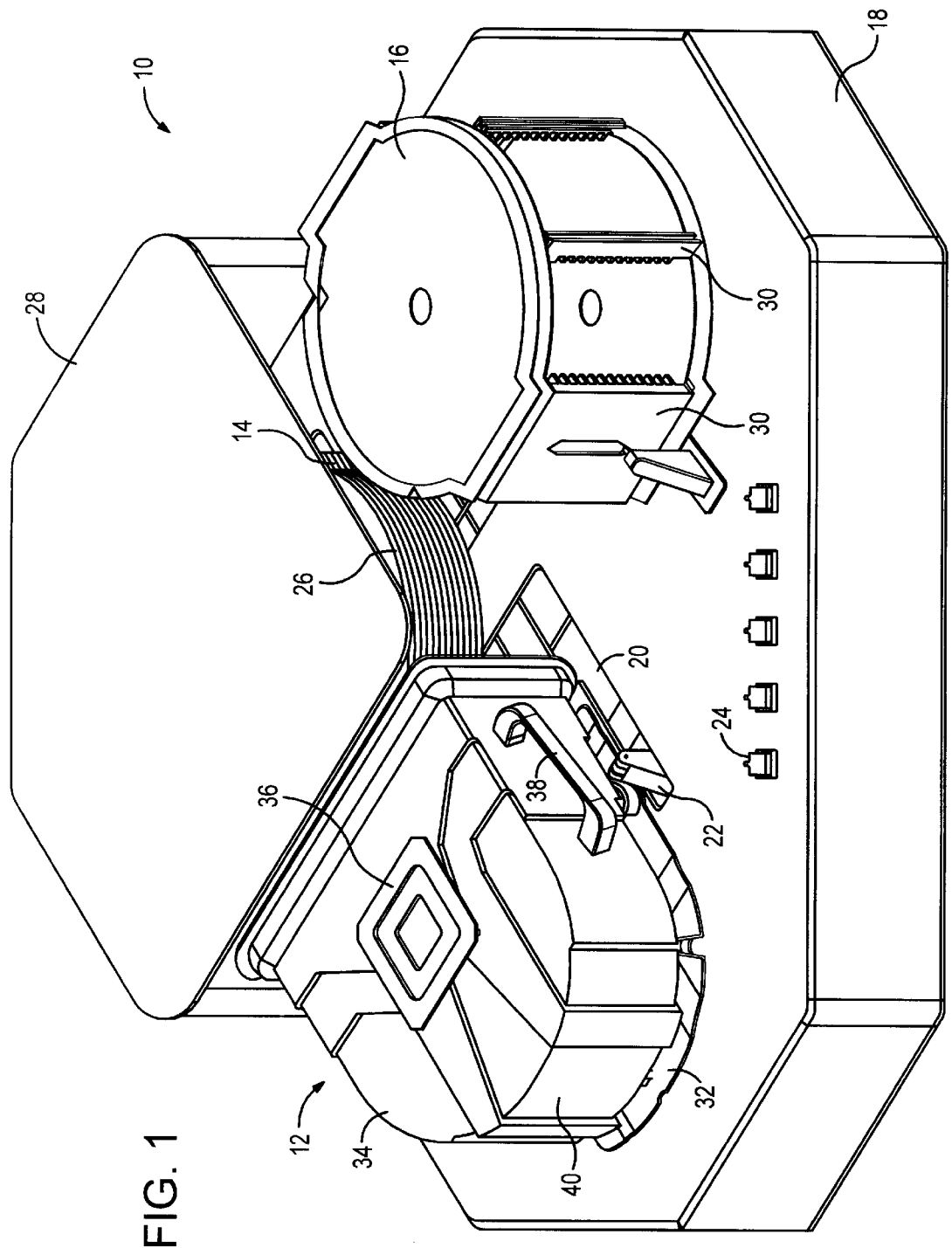
FIG. 1 is a perspective view of a wafer handling system that includes a size-convertible wafer supporting device in accordance with the invention.

With reference to FIG. 1, a wafer transfer system 10 is shown as including a Front Opening Unified Pod (FOUP) 12 having a front opening that faces a wafer handling device 14 for exchanging wafers between the FOUP and a removable cassette 16. The operation of the handling device 14 and the inclusion of the cassette 16 is not critical to the invention.

The transfer system 10 includes a base unit 18 with an upper opening 20 that is aligned with the front of the FOUP 12. The system includes a mechanism 22 for removing the front door of the FOUP and lowering the front door into the base unit 18. The door is automatically unlocked, moved vertically into the base unit, and then pivoted to a position below the FOUP. This may be done automatically by depression of one of the five control switches 24 shown in FIG. 1.

When the door of the FOUP 18 is removed, the wafer handling device 14 can be moved horizontally toward the FOUP. The handling device includes support rods that extend between adjacent semiconductor wafers within the pod 12. The handling device then lifts the wafers in unison and moves rearwardly to the position shown in FIG. 1. Twelve semiconductor wafers 26 are shown in the figure, but FOUPs typically have a capacity of either thirteen or twenty-five wafers.

A cover 28 protects the wafers 26 from falling particles when the wafers are removed from the pod 12. The handling device 14 pivots 90° under the protection of the cover 28, so that the handling device is aligned with the cassette 16. Horizontal displacement of the handling device moves the wafers 26 into the cassette 16. The cassette includes comb-like structures 30 that define slots for receiving the wafers 26. The slots have the same pitch as slots within the pod 12 and the same pitch as the support rods of the wafer handling device 14. Consequently, the handling device may be used to efficiently move the wafers from the pod to the cassette. Alternatively, the wafers may be moved from the cassette to the pod. Moreover, the cassette may be replaced with a processing chamber and the handling device may be replaced with a robotic member that removes wafers from the pod in a one-by-one sequence. That is, operation of the retrofit device to be described below is not restricted to the wafer transfer system 10 of FIG. 1.

The pod 12 may be identical to the one described in U.S. Pat. No. 5,711,427 to Nyseth, which is incorporated herein by reference. The pod includes a base portion 32 and a cover portion 34, and is dimensioned to store 300 mm diameter semiconductor wafers. The base portion is configured to be locked to the transfer system 10. The locking mechanism is not shown in FIG. 1. Extending from the cover portion 34 is an interface structure 36 that is used for releasably connecting the pod to other types of transfer systems. The pod also includes handles 38 connected at opposite sides of the side wall 40 of the pod. None of these external structures is critical to the invention.

Figure 2:
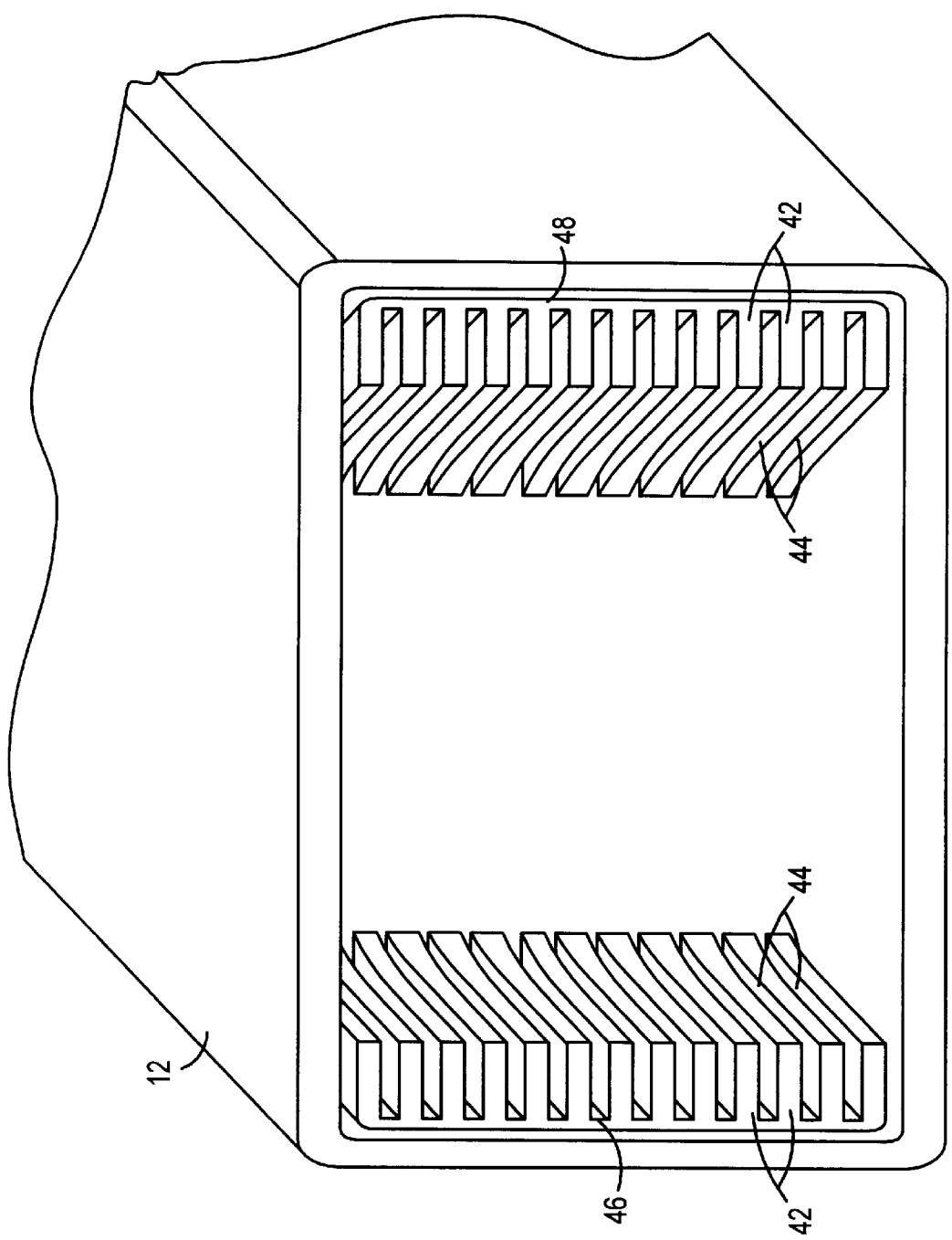
FIG. 2 is a front view of the size-convertible device of FIG. 1.

Referring now to FIG. 2, a simplified view of a wafer support device, such as the FOUP 12 of FIG. 1, is shown as comprising a first array of ribs 42. The ribs have a fixed center-to-center distance (i.e., pitch). In the application in which the ribs are designed to provide edge support for 300 mm diameter wafers, the standard pitch is 10 mm. However, the invention to be described below may be used in other applications. The wafers are inserted into slots 44 between adjacent ribs, and the configuration of the ribs and slots defines an insertion angle for receiving the semiconductor wafers.

In the illustration of FIG. 2, the ribs 42 are projections from continuous comb-like structures 46 and 48. However, FOUPs often include periodic vertical discontinuities of the horizontal ribs, and the areas of the discontinuities may be used in the attachment of the inserts to be described below with reference to FIGS. 3–7. The invention will be described and illustrated in an embodiment designed for attachment to the FOUP sold by Empak, Inc. under the federally registered trademark CAPSil.

Figure 3:
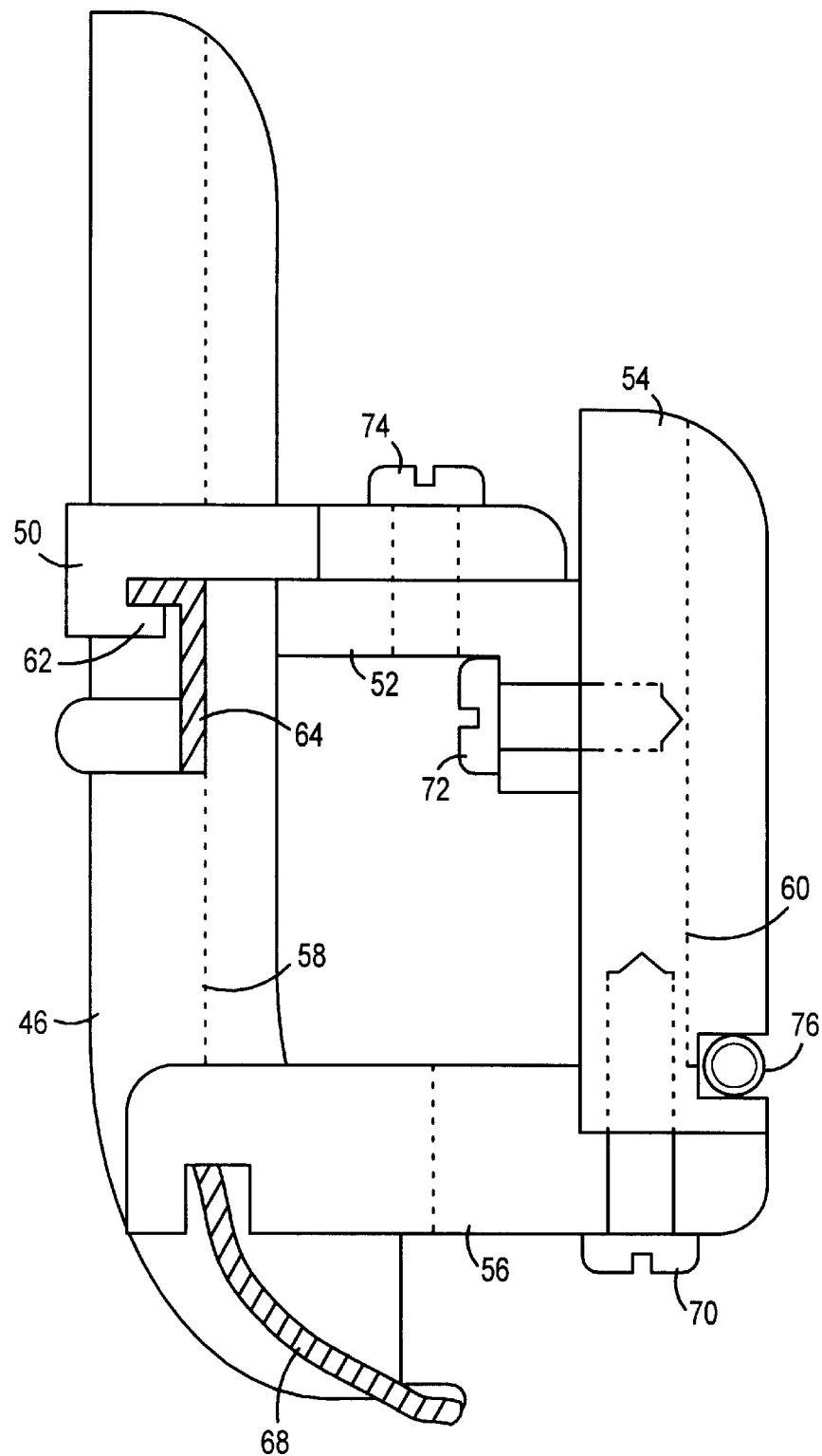
FIG. 3 is a top view of an attachment of an insert to the device of FIG. 2 in order to convert the device from use with wafers of one given size to use with wafers of a smaller size.

In the top view of FIG. 3, an insert has been added to one of the comb-like structures 46 of FIG. 2. The insert includes a lock bar 50, a stand-off 52, a small diameter wafer comb 54, and a leg rest 56. Dashed line 58 represents the inner wall of a large diameter slot of the comb-like structure 46. On the other hand, dashed line 60 of the smaller diameter wafer comb 54 represents the inner wall of a slot for receiving a small diameter semiconductor wafer. The distance between the two dashed lines 58 and 60 is one-half of the difference in the diameter of the two types of wafers that can be accommodated by adding or removing the insert of FIG. 3. Thus, if the insert is adapted for supporting wafers having a diameter of 200 mm and the original comb-like structure 46 is adapted for supporting 300 mm diameter wafers, the distance between line 58 and line 60 will be approximately 50 mm. This arrangement is mirrored on the opposite side of the wafer-support device, so that the insertion paths for the large and small diameter wafers will be identical.

The lock bar 50 of the insert is closer to the front of the wafer-support device than the leg rest 56. The lock bar includes an L-shaped end 62 that can be hooked onto a pre-existing structure 64 of the wafer-support device sold by Empak, Inc. The structure 64 is connected to the housing of the wafer-support device in any manner known in the art. Typically, the structure 64 is integral with the original rib structures 46 and 48, and is exposed at a vertical discontinuity in the horizontally extending ribs.

Similar to the lock bar 50, the leg rest 56 connects to pre-existing structure 68 of the wafer-supporting device. During mounting of the insert to the wafer-supporting device, such as a FOUP, the wafer comb 54 is securely attached to the leg rest 56 by a fastener 70 and to the stand-off 52 by a fastener 72. However, a third fastener 74 is only partially tightened to loosely hold the lock bar 50 to the stand-off 52. Each of the three fasteners is an externally threaded member. A groove in the leg rest 56 is aligned with the pre-existing structure 68 of the Empak, Inc. FOUP, and the L-shaped end 62 of the lock bar 50 is hooked around the pre-existing structure 64. The third fastener 74 is then tightened to securely hold the small diameter wafer comb 54 in position. Consequently, the wafer-support device is no longer able to receive large diameter wafers, but provides support for an array of smaller diameter wafers at a pitch that is the same as the original pitch. Moreover, the insert includes a wafer-stop tube 76 that sets the rest positions of the smaller diameter wafers such that the rest positions are coaxial with the rest positions of the large diameter wafers. This facilitates backward compatibility of robotic wafer transfer equipment that has been programmed for handling the large diameter wafers. That is, preferably no reprogramming of the equipment is necessitated by use of the inserts on the opposite sides of the wafer-supporting device. As will be explained with reference to FIG. 7, the wafer-stop tube 76 may be positioned such that the rest positions of the smaller diameter wafers are moved forwardly until the front regions of the edges of the smaller wafers are aligned with the intended front-edge positioning of the large diameter wafers. This modification is designed to facilitate backward compatibility with wafer transfer equipment that has been programmed for anticipating the positions of the front regions of the edges of wafers.

Figure 4:
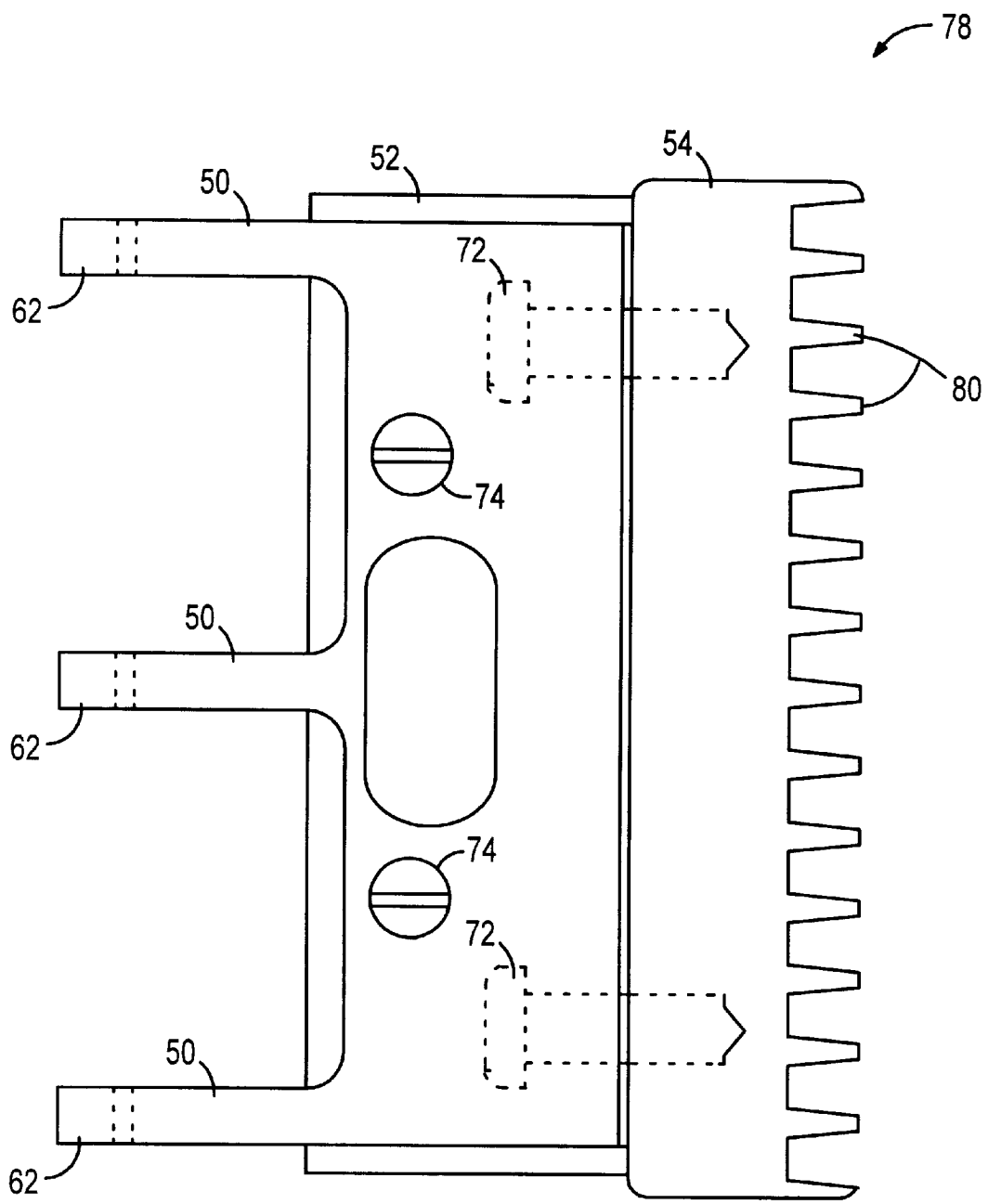
FIG. 4 is a front view of the insert of FIG. 3.

FIG. 4 is a front view of an insert 78 of the type described with reference to FIG. 3. In the front view, it can be seen that the insert includes three lock bars 50, rather than the single lock bar that can be seen in the top view of FIG. 3. The lock bars are integrally formed and are attached to the stand-off 52 by two externally threaded fasteners 74. A pair of fasteners 72 couple the stand-off to the small diameter wafer comb 54.

Figure 5:
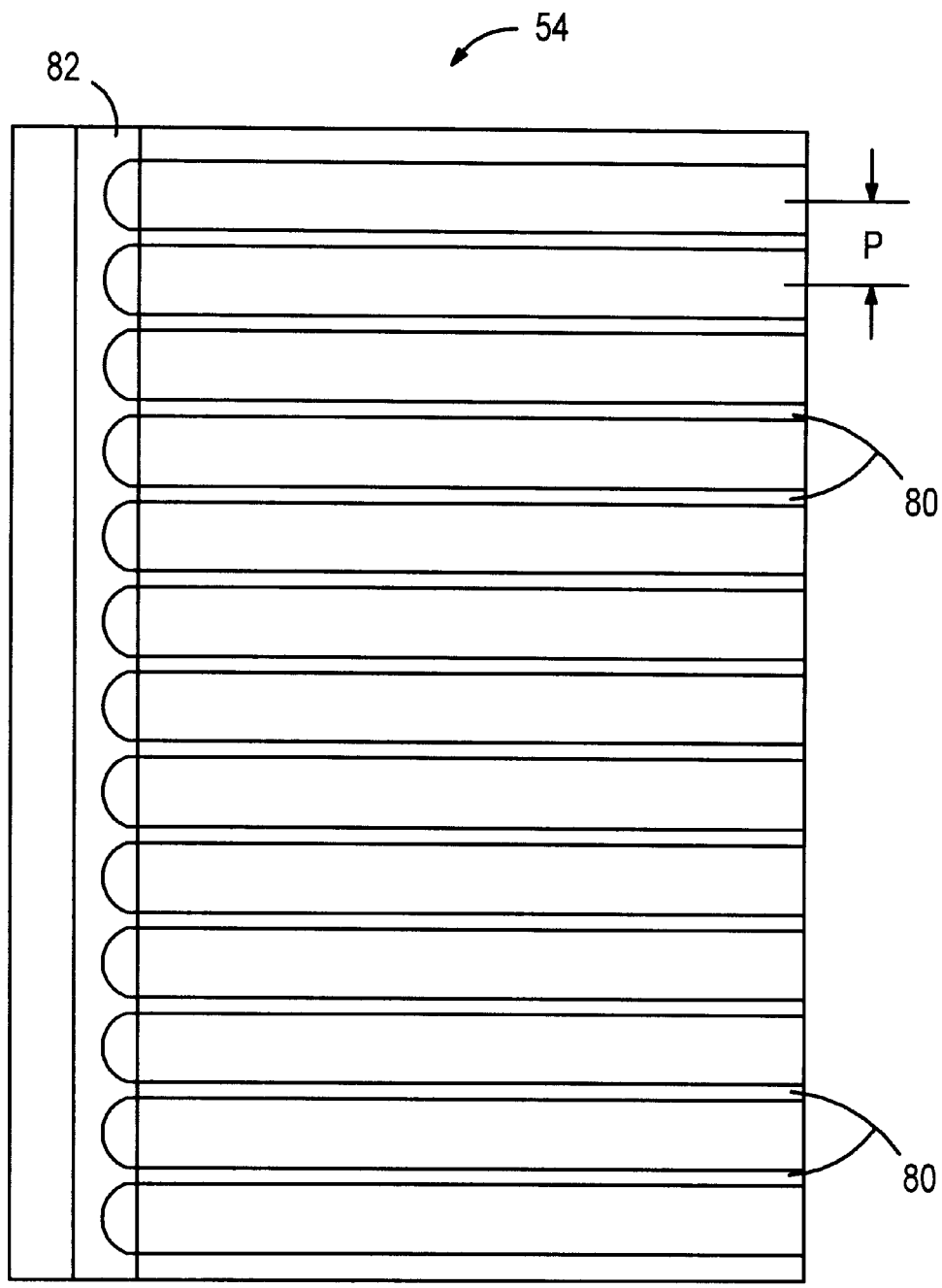
FIG. 5 is a side view of a comb of FIG. 4.

The small diameter wafer comb 54 includes second ribs 80 that have a pitch that is identical to the pitch of the wafer-support device to which the insert 78 is attached. As previously noted, the preferred embodiment is one in which the insert is used to change the wafer-support device from a 300 mm FOUP to a 200 mm FOUP. In this embodiment, the pitch of the ribs 80 is 10 mm. FIG. 5 illustrates a side view of the wafer comb 54. The slots between adjacent ribs 80 have a pitch P, as previously described. The wafer comb also includes a vertical slot 82 to receive the wafer-stop tube 76 of FIG. 3. The tube is formed of a non-particulating material, so that the wafers are not damaged or contaminated by contact with the tube. The wafer-stop tube may be friction fit into the vertical slot 82, or additional structure may be used to provide a more secure connection.

Figure 6:
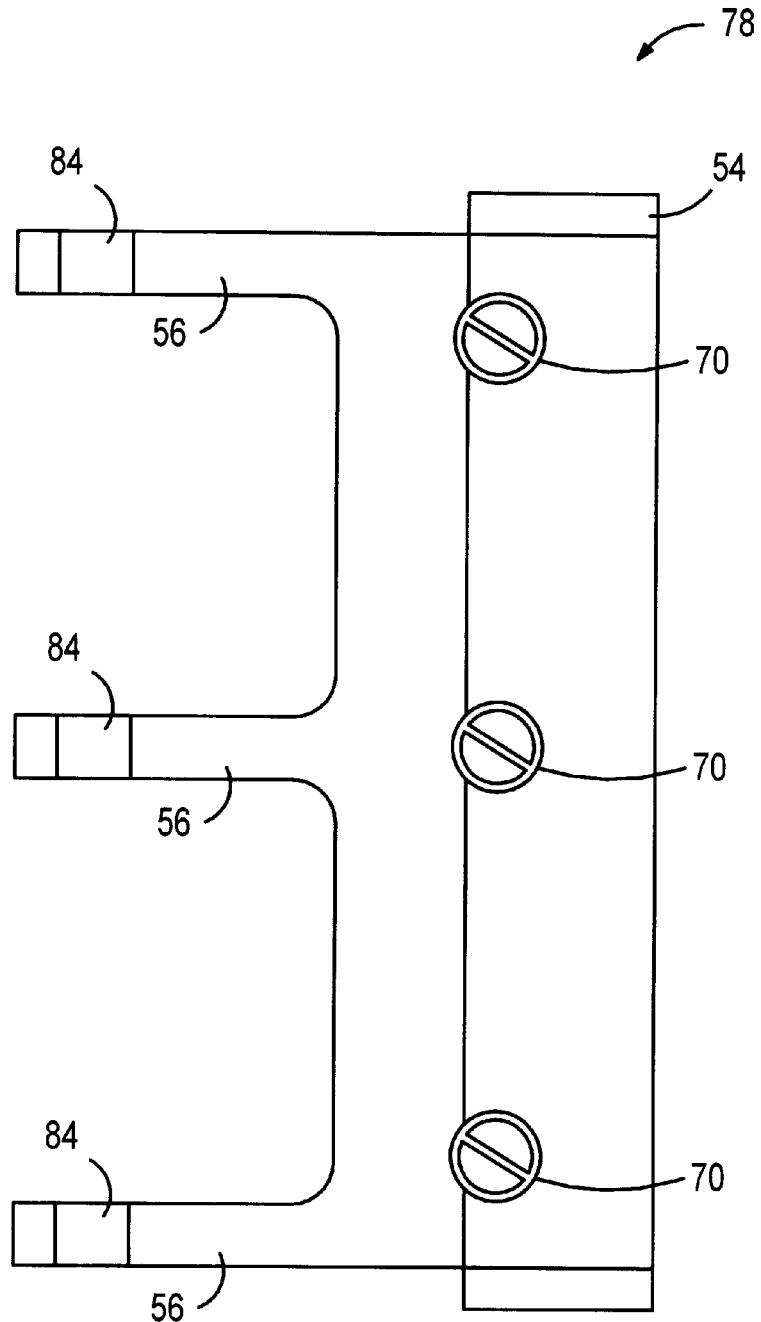
FIG. 6 is a rear view of the insert of FIG. 4.

FIG. 6 illustrates a rear view of the insert 78 of FIGS. 3 and 4. In this view, it can be seen that there are three fasteners 70 that connect the small diameter wafer comb 54 to the leg rest assembly and that there are a total of three integrally formed leg rests 56. Each one of the leg rests includes a groove 84 for connecting the insert to the pre-existing structure 68 shown in FIG. 3.

In the embodiment of FIG. 3, the wafer rest positions defined by the wafer comb 54 and the tube 76 will be coaxial with the wafer rest positions defined by the original comb-like structure 46. However, in the embodiment of FIG. 7, an adapter member 84 has been added between the leg rest 56 and the wafer comb 54, moving the wafer-stop tube 76 and the wafer comb forwardly to a position in which the rest positions are no longer coaxial. Rather, the forward edges of wafers within the defined rest positions are aligned. As a consequence, if the wafer-supporting device could simultaneously accommodate both the small and large diameter wafers, the front edges would be aligned. This alignment is important if the wafer-support device (e.g., a FOUP) is to be used with a robotic device that is programmed to pickup and deliver wafers to positions that are defined in programming to anticipate the positions of the front regions of the edges of the wafers. The adapter member 84 is secured to the comb 54 by fasteners 86.

Figure 7:
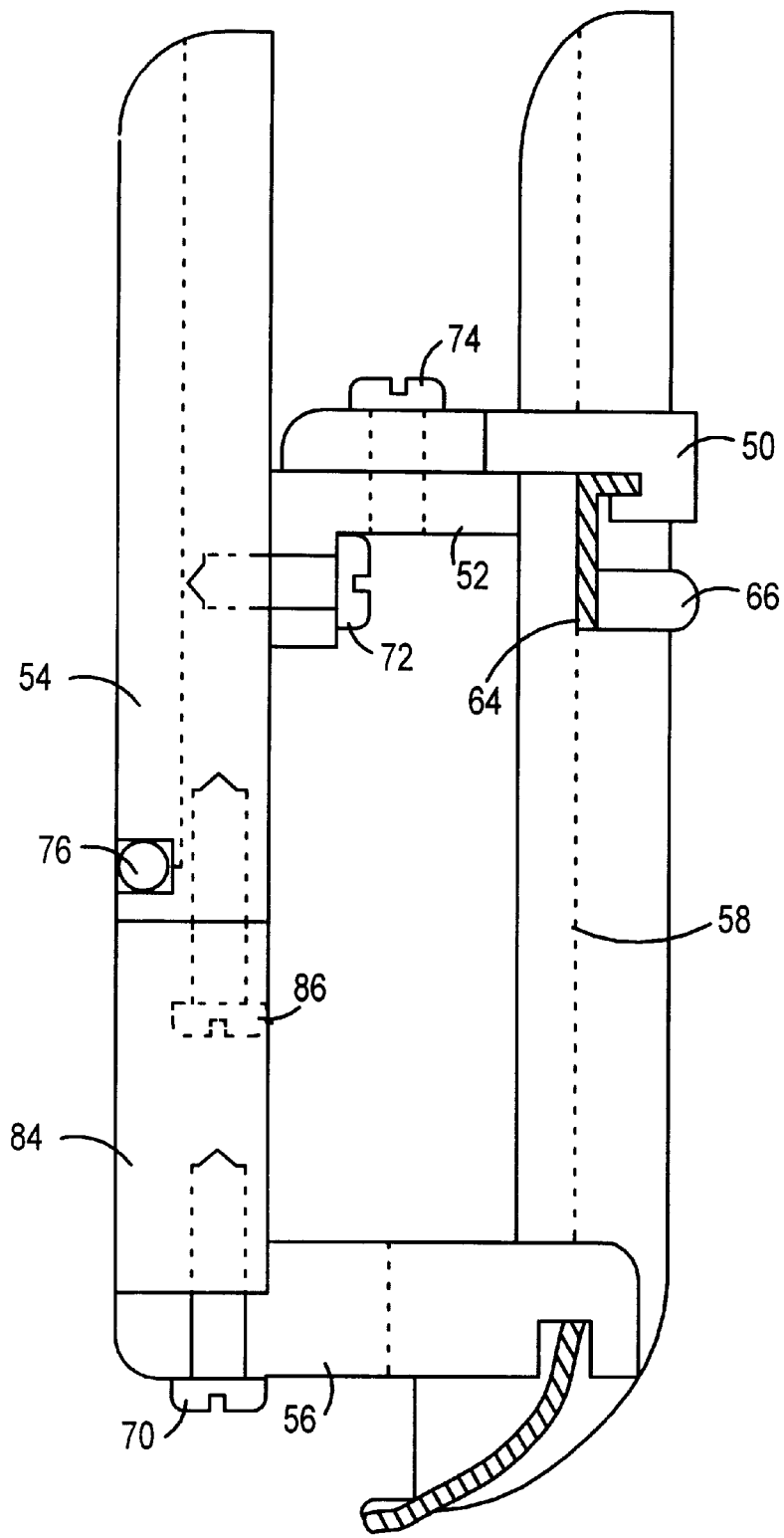
FIG. 7 is a top view of an alternative embodiment of the insert for providing a retrofit for a wafer-supporting device.

While the adapter member may be a fixed block, as shown in FIG. 7, the ability to move the axis of the rest positions of the small diameter wafers may be accomplished in other manners. For example, the insert may include a slide mechanism that is adjustable between forward and rearward positions for defining the rest positions of the small diameter wafers.

What is claimed is:

1. A retrofit device for a FOUP having first ribs that provide support for an array of large diameter semiconductor wafers having aligned rest positions, said first ribs extending along opposite sides of a first wafer-storage area of said FOUP, said retrofit device comprising:

at least one insert configured for removable attachment to said FOUP in a position such that second ribs are coplanar with said first ribs, said second ribs being cooperative to provide support for small diameter semiconductor wafers, said second ribs extending along opposite sides of a reduced wafer-storage area for said small diameter semiconductor wafers, said reduced wafer-storage area being coaxial with said first wafer-storage area for said large diameter semiconductor wafers, said reduced wafer-storage area and said first wafer-storage area thereby being concentric, said at least one insert blocking simultaneous support of large and small diameter semiconductor wafers.

2. The retrofit device of claim 1 wherein each insert includes means for adjusting said insert from a first mode in which said first and reduced wafer-storage areas are coaxial to a second mode in which said first and reduced wafer-storage areas are located such that front regions of edges of said first and reduced wafer-storage areas are coplanar.

3. The retrofit device of claim 1 wherein said at least one insert includes first and second inserts, each said insert having said second ribs on a first side and having means for attaching said insert to said FOUP on a second side opposite to said first side.

4. A retrofit device for a front opening member having first ribs that provide support for an array of large diameter wafers having aligned rest positions, said first ribs extending along opposite sides of a first wafer-storage area of said front opening member, said retrofit device comprising:

at least one insert configured for removable attachment to said front opening member in a position such that second ribs are coplanar with said first ribs, said second ribs being cooperative to provide support for small diameter wafers, said second ribs extending along opposite sides of a reduced wafer-storage area for said small-diameter wafers, said reduced wafer-storage area being axially misaligned from said first wafer-storage area in a direction of a front opening of said front opening member by a distance such that front regions of edges of said first and reduced wafer-storage areas are coplanar, said at least one insert blocking simultaneous support of large and small diameter wafers.

5. The retrofit device of claim 4 wherein each insert includes means for adjusting said insert from a first mode in which said first and reduced wafer-storage areas are coaxial to a second mode in which said first and reduced wafer-storage areas are located such that said front regions of said edges are coplanar.

6. The retrofit device of claim 4 wherein said at least one insert is configured for attachment to a FOUP.

7. The retrofit device of claim 4 wherein said at least one insert includes first and second inserts, each insert having second ribs on a first side and having means for attaching said insert on a second side opposite to said first side.

8. A retrofit device for a front opening member having first ribs that provide support for an array of large diameter wafers having aligned rest positions, said first ribs extending along opposite sides of a first wafer-storage area of said front opening member, said retrofit device comprising:

at least one insert configured for removable attachment to said front opening member in a position such that second ribs are coplanar with said first ribs, said second ribs being cooperative to provide support for small diameter wafers, said second ribs extending along opposite sides of a reduced wafer-storage area for said small diameter wafers, said reduced wafer-storage area being coaxial with said first wafer-storage area for said large diameter wafers, said reduced wafer-storage area thereby being concentric with said first wafer-storage area, said at least one insert blocking simultaneous support of large and small diameter wafers.

9. The retrofit device of claim 8 wherein each insert includes means for adjusting said insert for a first mode in which said first and reduced wafer-storage areas are coaxial to a second mode in which said first and reduced wafer-storage areas are located such that front regions of edges of said first and reduced wafer-storage areas are coplanar.

\* \* \* \* \*